United States Patent
Sato et al.

(10) Patent No.: US 6,924,596 B2
(45) Date of Patent: Aug. 2, 2005

(54) LIGHT EMITTING APPARATUS PROVIDED WITH FLUORESCENT SUBSTANCE AND SEMICONDUCTOR LIGHT EMITTING DEVICE, AND METHOD OF MANUFACTURING THE SAME

(75) Inventors: Masanobu Sato, Anan (JP); Tomoya Tsukioka, Anan (JP); Masafumi Kuramoto, Anan (JP)

(73) Assignee: Nichia Corporation, Tokushima (JP)

( * ) Notice: Subject to any disclaimer, the term of this patent is extended or adjusted under 35 U.S.C. 154(b) by 38 days.

(21) Appl. No.: 10/284,455

(22) Filed: Oct. 31, 2002

(65) Prior Publication Data

US 2003/0132701 A1 Jul. 17, 2003

(30) Foreign Application Priority Data

Nov. 1, 2001 (JP) .................................... P 2001-336944

(51) Int. Cl.[7] ................................................. H01J 1/62
(52) U.S. Cl. ........................................ 313/512; 313/501
(58) Field of Search ............................... 313/498–512; 427/66; 428/690, 917; 525/408

(56) References Cited

U.S. PATENT DOCUMENTS

| | | | | |
|---|---|---|---|---|
| 4,501,853 A | * | 2/1985 | Sugimori et al. ........... | 525/122 |
| 4,934,791 A | * | 6/1990 | Shimizu et al. ............. | 349/107 |
| 6,040,005 A | * | 3/2000 | Carr et al. .................. | 427/197 |
| 6,180,726 B1 | * | 1/2001 | Eklund et al. .............. | 525/408 |
| 6,249,372 B1 | * | 6/2001 | Kobayashi et al. ......... | 359/326 |
| 6,635,363 B1 | * | 10/2003 | Duclos et al. .............. | 428/690 |
| 2004/0006185 A1 | * | 1/2004 | Campbell et al. .......... | 525/418 |

FOREIGN PATENT DOCUMENTS

| | | | | |
|---|---|---|---|---|
| JP | 5-152609 | | 6/1993 | |
| JP | 07098409 A | * | 4/1995 | ............ G02B/5/20 |
| JP | 7-099345 | | 4/1995 | |
| JP | 9-059352 | | 3/1997 | |
| JP | 09197116 A | * | 7/1997 | ............ G02B/5/20 |
| JP | 2000-196151 | | 7/2000 | |
| JP | 2000-281760 | | 10/2000 | |
| JP | 2000-281761 | | 10/2000 | |

\* cited by examiner

*Primary Examiner*—Nimeshkumar D. Patel
*Assistant Examiner*—German Colón
(74) *Attorney, Agent, or Firm*—Morrison & Foerster LLP (57) ABSTRACT

In a light emitting apparatus comprising a light emitting device, a fluorescent substance capable of absorbing at least a portion of light emitted by the light emitting device and emitting light having a different wavelength, and a color converting member which contains the fluorescent substance and directly coat the light emitting device, the color converting member contains at least an epoxy resin derived from triazine and a mixing ratio of the epoxy resin derived from triazine to the acid anhydride curing agent in the color converting member is from 100:80 to 100:240.

5 Claims, 5 Drawing Sheets

TGIC

Main component of curing agent

LIGHT EMITTING APPARATUS PROVIDED WITH FLUORESCENT SUBSTANCE AND SEMICONDUCTOR LIGHT EMITTING DEVICE, AND METHOD OF MANUFACTURING THE SAME

TECHNICAL FIELD

The present invention relates to a light emitting apparatus that can be used as back light, light source for an illuminating switch, display and indicator. Particularly, the present invention relates to a light emitting apparatus capable of emitting light with high luminance over a long period of use.

BACKGROUND ART

Semiconductor light emitting device such as LED and LD (laser diode) are small in size and emits light of clear color efficiently. Also as semiconductor devices, they do not burn out, have good drive characteristic and are durable against vibration and repetitive operations of switching ON/OFF. For these reasons, they are used as various indicators and various light sources. However, since such semiconductor light emitting device has monochromatic peak wavelength, it has been necessary to use two or more kinds of semiconductor light emitting device to emit whitish light (white, pink or incandescent-like illumination).

Figure 4A:
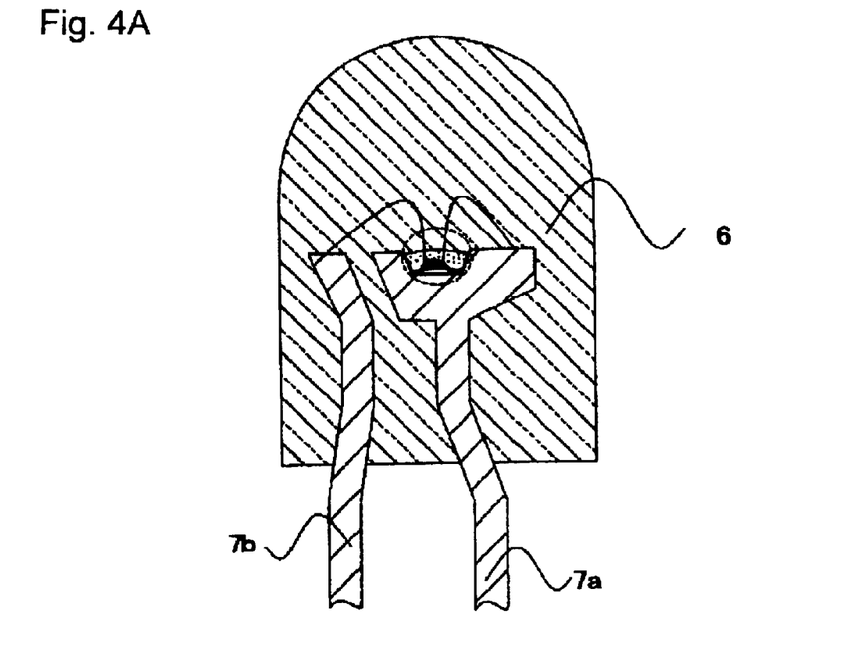
FIG. 4A is a schematic sectional view of a light emitting diode of the prior art.

In the meantime, semiconductor light emitting device made by combining LED chip that emits light of monochromatic peak wavelength and a fluorescent substance for emitting light of various colors with a single light emitting device is known as disclosed in Japanese Unexamined Patent Publication (Kokai) No. 5-152609 (Patent Document 1) and Japanese Unexamined Patent Publication (Kokai) No. 7-99345 (Patent Document 2). FIG. 4A is a schematic diagram showing an example of such a semiconductor device. Such a semiconductor light emitting device comprises an LED chip 1 that has a relatively large band gap energy in the light-emitting layer and is disposed on a cup or the like that is mounted at the distal end of a lead frame consisting of a pair of lead electrodes 7a and 7b. The LED chip 1 is electrically connected to a first lead 7a and a second lead 7b provided with the LED chip 1. A color converting member 5, containing a fluorescent substance 4 which absorbs light emitted by the LED chip and converts the wavelength of the light, is formed in contact with the LED chip 1, and a molding member 6 that covers the whole is formed adjacent to the color converting member 4.

The color converting member 4, light transmitting resin that makes the a base material for the molding member 5 and a mounting member 2 used in the semiconductor light emitting device are made of various synthetic resins in view of productivity, ease of handling and transparency. For the molding member 5, in particular, epoxy resin that is resistant to external force is preferably used. In consideration of the close contact with the molding member 5 and compatibility with the mechanical properties, the color converting member 4 provided inside is also preferably made of epoxy resin It is proposed to use, as the epoxy resin, an epoxy resin composition which is made mainly of an alicyclic epoxy resin and is cured by an acid anhydride. The epoxy resin cured by a curing agent made of an acid anhydride is superior in light transmission properties and light resistance. For example, Unexamined Japanese Patent Publication (Kokai) No. 2000-196151 (Patent Document 3) discloses a molding resin made mainly of an alicyclic epoxy resin instead of a general bisphenol type epoxy resin. Since the epoxy resin, which is made mainly of an alicyclic epoxy resin and is cured by an acid anhydride, hardly include a carbon-carbon double bond, which can cause light deterioration, in chemical structure, deterioration of the molding resin is less likely to occur even after irradiation with light for a long time.

DISCLOSURE OF THE INVENTION

However, in the light emitting apparatus of the prior art described above, luminance tends to undergo chronological change after an extended period of use, and unevenness in color tends to occur. In the meantime, dramatic advancements in the opto-semiconductor technology in recent years have caused a remarkable increase in the output power and a push toward shorter wavelengths of the opto-semiconductor devices. For example, a light emitting diode based on a nitride semiconductor is capable of emitting light with a main emission peak located somewhere in a range from about 365 nm to 650 nm depending on the elements that constitute the light emission layer. Emission of light with high output power of 5 mW or over is possible in a region of visible light of wavelength shorter than 550 nm (from near ultraviolet region to blue green light), when multiple quantum well structure is used in the light emission layer of the nitride semiconductor. A semiconductor device capable of emitting or receiving light of such a high energy level is particularly prone to chronological change in luminance and color unevenness.

With the background described above, an object of the present invention is to provide a light emitting apparatus that is capable of emitting light with uniform and high luminance for a long period of time with less color unevenness, and a method of manufacturing the same.

The inventor of the present application found, based on many experiments, that the cause of chronological change in luminance and color unevenness in small color conversion type light emitting apparatus is related to the reliability of a color converting member 5 containing a fluorescent substance 4 and seals the light emitting device 1. Major causes of the chronological change in luminance and color unevenness are non-reacted portion of epoxy resin that makes the color converting member 5 and precipitation of fluorescent substance particles that are dispersed in the epoxy resin.

The effect of the non-reacted portion of epoxy resin will first be described. An acid anhydride curing agent is often preferred as the curing agent for the reason of transparency and light resistance for the purpose of curing the epoxy resin. However, since the acid anhydride curing agent requires a relatively long curing time, it is prone to absorption of moisture and evaporation during the curing process. In such a color conversion type light emitting apparatus, since the light emitting device 1 is sealed with the color converting member 5 made of a light transmitting resin containing the fluorescent substance 4 which, as a whole, is sealed by the transparent molding member 6, reduction in size of the light emitting apparatus leads to an extremely small thickness of the color converting member 5, typically about 1 mm or less. This results in larger area of contact between the resin solution that has been applied and the ambient air, thus making the curing agent more likely to evaporate. When the color converting member 5 is formed from an epoxy resin solution containing the acid anhydride curing agent, for example, there may occur such a case that the acid anhydride curing agent evaporates and the epoxy resin cannot be normally cured.

Epoxy resin that has not been normally cured cannot demonstrate the properties of the resin, and light resistance and heat resistance tend to degrade significantly. The portion that remains non-reacted not only degrades the properties of the resin but also absorbs radiation in the ultraviolet or near ultraviolet (blue) region, thus resulting in yellowish discoloration. Yellowing of the resin causes disturbance of color balance and color unevenness of the semiconductor light emitting device. In the case of a light emitting apparatus that combines the semiconductor light emitting device and a fluorescent substance, in particular, curing failure of the epoxy resin in the semiconductor light emitting device causes a serious problem. In a light emitting apparatus that emits white light by blending blue light and yellow light, for example, yellowing of the epoxy resin of the color converting member causes disturbance of color balance in white light. Since human eyes are more sensitive to color shift of white color than that of light of single color, even a slight color shift due to yellowing of the epoxy resin causes a serious problem.

Figure 4B:
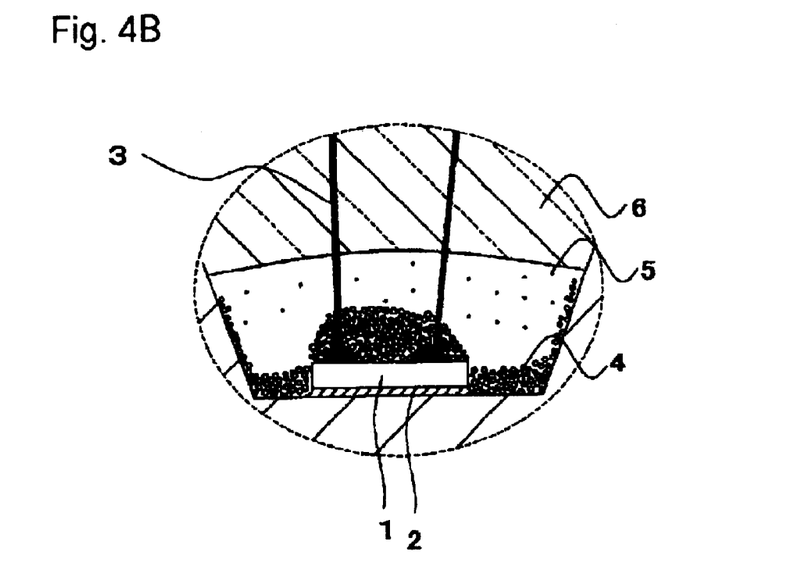
FIG. 4B is a partially enlarged sectional view of FIG. 4A.

Now the effect of precipitation of the fluorescent substance particles 4 in the color converting member 5 will be described below. In the color conversion type light emitting apparatus, dispersion of the fluorescent substance 4 in the color converting member 5 that seals the light emitting device 1 has a significance. When the fluorescent substance particles 4 precipitate in the color converting member 5 as shown in FIG. 4B, light emitted by the light emitting device 1 is blocked by the fluorescent substance particles 4, thus decreasing the luminance of the light emission by the light emitting apparatus. Also color reproducibility decreases due to imbalance between the light emitted by the light emitting device 1 and the light converted by the fluorescent substance particles 4. Also because density of the fluorescent substance particles 4 around the light emitting device 1 becomes susceptible to change depending on the position, color unevenness tends to occur.

When the fluorescent substance 4 is mixed in a liquid resin as in the case of the epoxy resin of the prior art, the fluorescent substance 4 precipitates due to the difference in specific gravity and it is difficult to achieve stable dispersion. Precipitation of the fluorescent substance 4 may be restrained by potting the resin while mixing the epoxy resin solution in a potting machine that has a mixer. However, as the light emitting apparatus becomes smaller, the potting machine also becomes smaller and therefore mixing of the epoxy resin solution with a mixer in the small space may result in damaging of the inner wall of the instrument with the broken chips mixing in the resin. Also the mixing operation may cause worn-out damage of the crystal on the surface of the fluorescent substance particles in the epoxy resin solution, thus resulting in a deterioration of the optical properties. There is also such a technique that adds a filler and/or a diffusing agent together with the fluorescent substance to the epoxy resin solution. While this improves dispersion to some extent, addition of a large quantity of dispersant to achieve significant dispersion effect leads to blocking of the light extraction path thus resulting in lower output power.

Thus, the present invention provides an optical semiconductor device, which is superior in reliability and can uniformly emit light, by a technique of completing curing of an epoxy resin derived from triazine having particularly high curing rate among non-aromatic epoxy resins having excellent light resistance at the state where a curing agent is maintained at a stoichiometric number.

The light emitting apparatus of the present invention comprises a light emitting device, a fluorescent substance that is capable of absorbing at least a part of light emitted by the light emitting device and emitting light of a different wavelength, and a color converting member containing the fluorescent substance and covers the light emitting device, wherein the color converting member has at least epoxy resin derived from triazine. Because of high curing rate of the epoxy resin derived from triazine, the residue of the unreacted portion due to lack of the curing agent can be suppressed even when using a volatile curing agent such as acid anhydride. The epoxy resin derived from triazine of the present invention is solid (for example, powder) at normal temperature before curing and has an action of assisting dispersion of a fluorescent substance, but is converted into a transparent resin after curing. Thus, the present invention provides an optical semiconductor device, which is superior in optical characteristics and reliability, by suppressing poor curing of the resin and precipitation of the fluorescent substance occurred in the color converting member.

The epoxy resin derived from triazine is preferably an epoxy resin as a derivative of 1,3,5-triazine ring. Particularly, an epoxy resin having an isocyanurate ring is superior in light resistance and satisfactorily assists dispersion of a fluorescent substance. The epoxy resin preferably has a divalent trivalent epoxy resin, more preferably a trivalent epoxy resin, in an isocyanurate ring.

In the color converting member, the light resistance and toughness of the color converting member are improved by curing the epoxy resin derived from triazine using an acid anhydride curing agent. A mixing ratio of the epoxy resin derived from triazine to the acid anhydride curing agent is preferably from 100:80 to 100:240 to obtain a light emitting apparatus having excellent reliability.

The method of manufacturing a semiconductor light emitting apparatus comprising a light emitting device, a fluorescent substance capable of absorbing at least a portion of light emitted by the light emitting device and emitting light having a different wavelength, and a color converting member which contains the fluorescent substance and directly coat the light emitting device, said method comprising:

a first step of adding a powdered resin in a curing solution containing an acid anhydride curing agent as a main component at a temperature lower than a melting point of the resin to prepare a mixed solution, adding a powdered fluorescent substance in the mixed solution, and uniformly dispersing or dissolving the powdered fluorescent substance; and a second step of coating the light emitting device with the dispersion obtained in the first step, and heating to a temperature higher than a melting point of the resin, thereby to cure the dispersion to form a color converting member.

According to the manufacturing method of the present invention, since the powdered resin assists the dispersion of the fluorescent substance particles, a color converting member having the fluorescent particles well dispersed therein can be made. Thus it is made possible to easily manufacture the light emitting apparatus that can maintain uniform light emission for a long period of time regardless of the shape and size of the fluorescent substance particles.

It is preferred that the powered resin is transparent before curing and exhibits light transmission properties after curing in the second step. Consequently, it is made possible to easily handle the resin and to easily grasp the dispersion state of in the step of preparing a dispersion and the step of directly coating a light emitting device with the dispersion. Also it can be easily confirmed whether or not the reaction between the resin and the curing agent has been completed.

The powdered resin is preferably an epoxy resin derived from triazine, and particularly an epoxy resin having an isocyanturate ring. The epoxy resin derived from triazine causes the curing reaction at a very high rate when converted into liquid by heating to a temperature higher than a melting point. Therefore, poor curing of the resin can be prevented even in case the color converting member is applied to form a thin film using a volatile curing agent such as acid anhydride curing agent. Therefore, a light emitting apparatus having high reliability can be manufactured by controlling a mixing ratio of the epoxy resin to the acid anhydride curing agent to a value closer to a stoichiometric number. To supplement volatilization of a small amount of the acid anhydride curing agent, a curing solution may contain an acid anhydride in the amount which is slightly larger than a stoichiometric number of the epoxy compound to be cured.

BEST MODE FOR CARRYING OUT THE INVENTION

Now preferred embodiments of the present invention will be described below with reference to attached drawings.

Figure 1A:
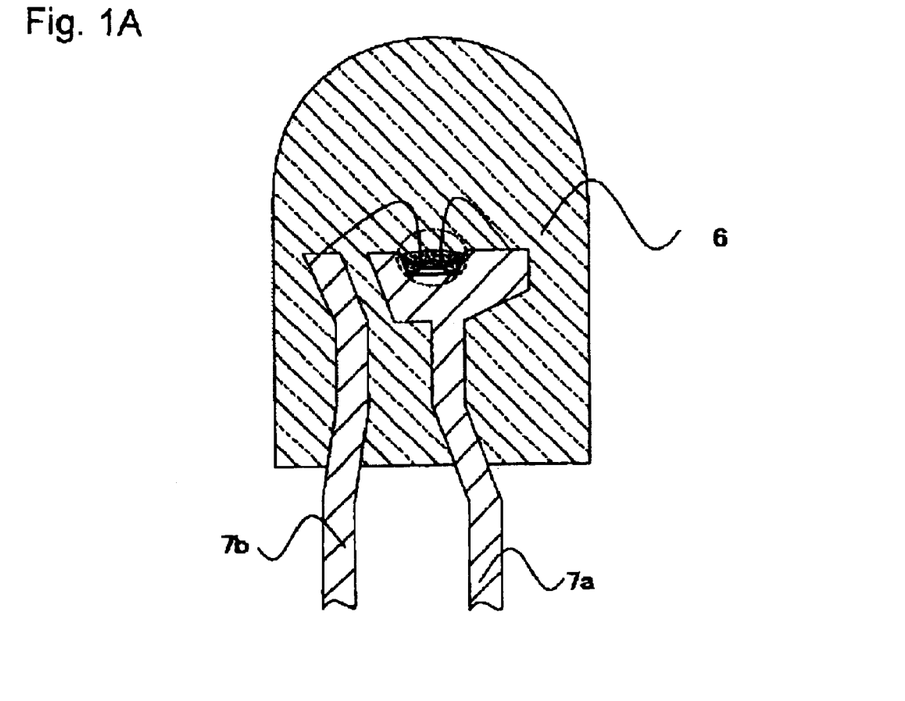
FIG. 1A is a schematic sectional view showing a light emitting diode of the present invention.
Figure 1B:
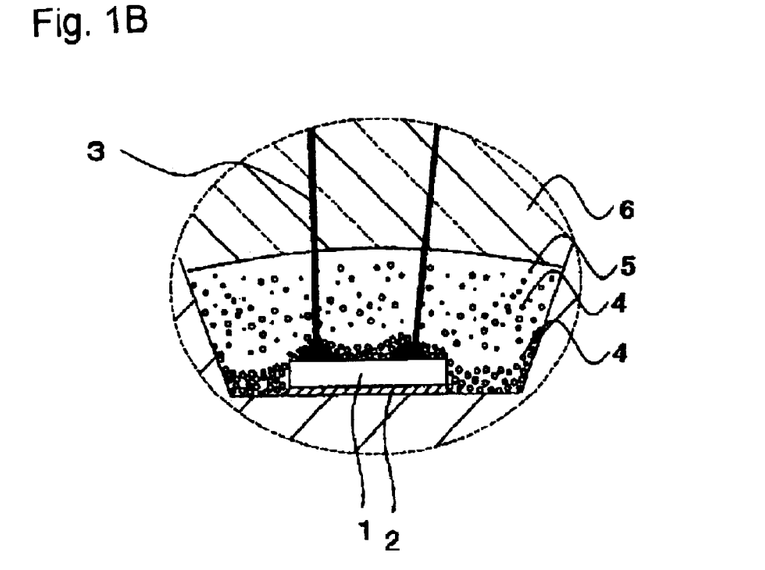
FIG. 1B is a partially enlarged sectional view of FIG. 1A.
Figure 2:
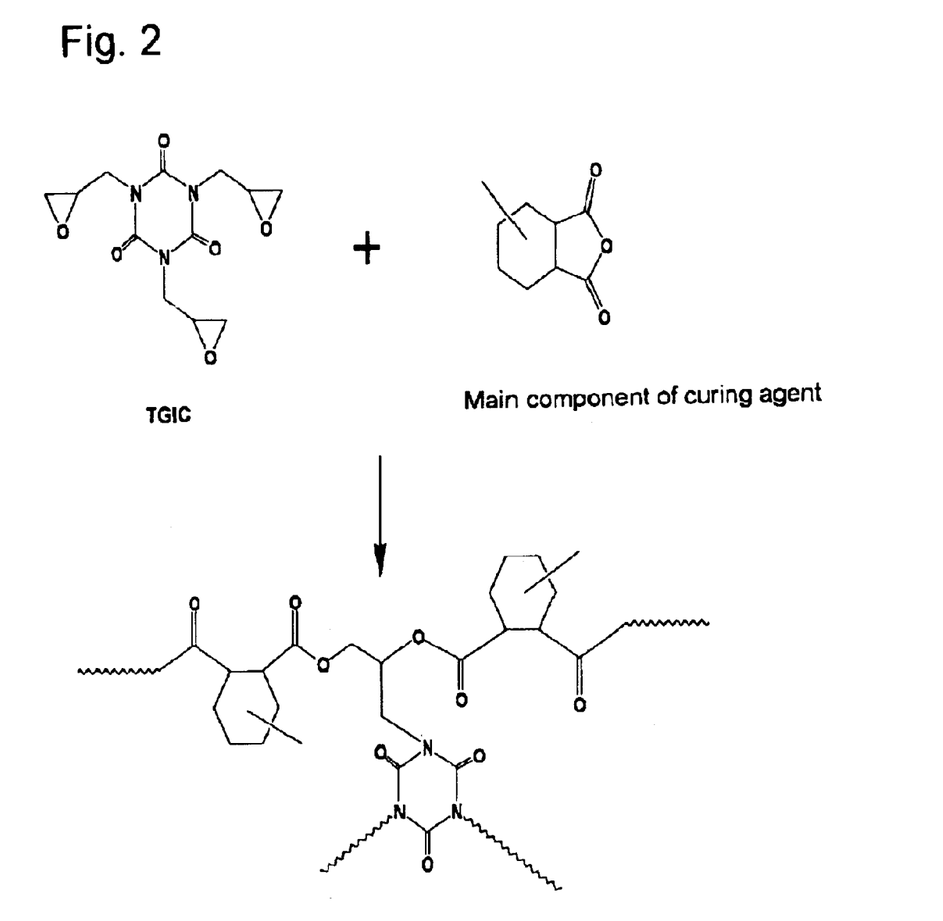
FIG. 2 is a diagram showing an example of reaction between a epoxy resin derived from triazine and an acid anhydride curing agent.

FIG. 1A is a schematic sectional view of an example of semiconductor light emitting device according to an embodiment of the present invention, and FIG. 1B is a partially enlarged sectional view of FIG. 1A. An LED chip 1 that has a relatively large band gap energy in the light emission layer is secured by a mounting member 2 on a cup or the like that is mounted at the distal end of a lead frame consisting of a pair of lead electrodes 7a and 7b. The LED chip 1 is electrically connected to a first lead 7a and a second lead 7b provided with the LED chip 1. A color converting member 5, containing a fluorescent substance 4 which absorbs light emitted by the LED chip 1 and converts the wavelength of the light, is formed in contact with the LED chip 1, and a molding member 6 that covers the whole is formed adjacent to the color converting member 4.

The color converting member 5 is made from a epoxy resin derived from triazine that has been cured by a curing agent and contains the fluorescent substance 4 dispersed therein relatively uniformly. There is no particular limitation to the color converting member as long as it contains at least epoxy resin derived from triazine, but it may also contain such additives as a filler, a promoter, a curing assisting agent, an anti-oxidant and a diffusion agent.

Figure 3:
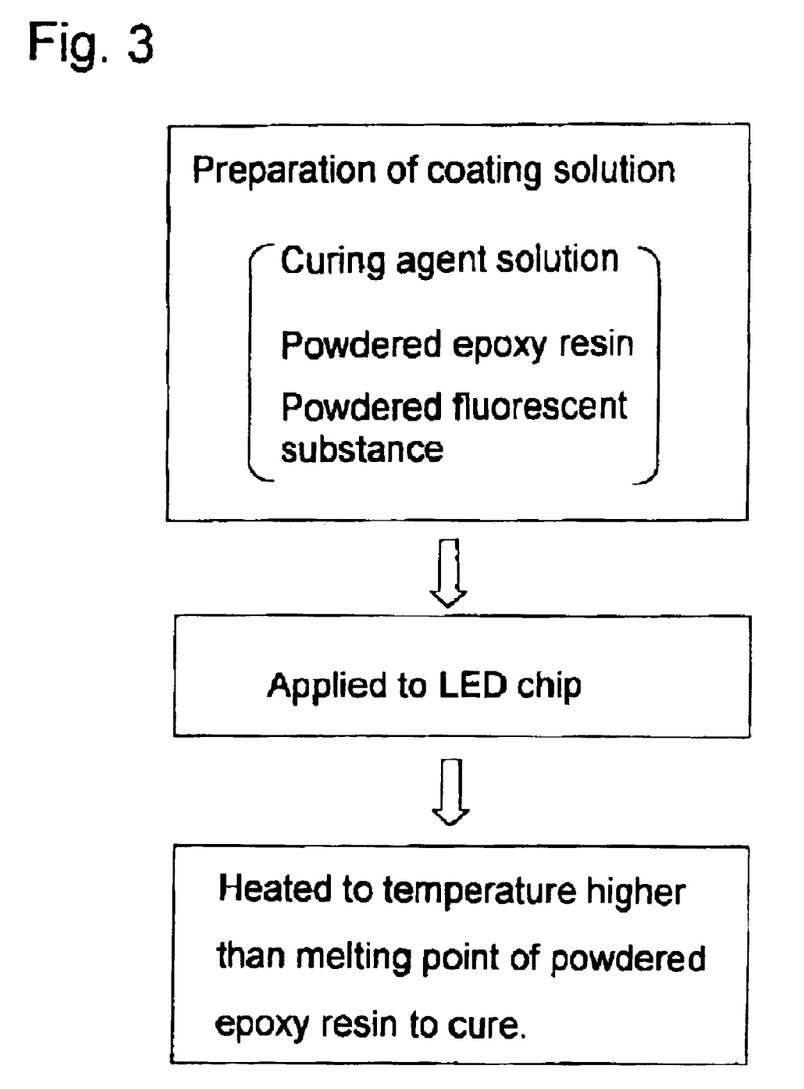
FIG. 3 is a process diagram showing the method of manufacturing the color converting member according to the present invention.

The color converting member 5 is formed by the method shown in FIG. 3.

(1) First, powder of epoxy resin derived from triazine is added to a solution of the acid anhydride curing agent at a temperature lower than the melting point of the resin to prepare a mixture solution. A fluorescent substance in the form of yellow powder is added to the mixture solution and uniformly dispersed to prepare a coating solution (epoxy resin compound). Since the epoxy resin derived from triazine used in the present invention is typically a white powder, the coating solution is generally white before curing.

(2) After covering the LED chip 1 with the coating solution, it is heated to a temperature higher than the melting point of the epoxy resin derived from triazine, thereby to react the epoxy resin derived from triazine with the curing agent to form a color converting member 5. After curing, the epoxy resin derived from triazine is transparent and the color converting member 5 has a yellowish color. Therefore, progress of curing of the resin can easily be monitored by checking the color of the color converting member.

When the curing agent and the fluorescent substance are mixed in the resin that contains the epoxy resin derived from triazine at a temperature lower than the melting point as described above, the epoxy resin derived from triazine plays the role of dispersant so as to restrain the fluorescent substance from precipitation. As the solution containing the fluorescent substance satisfactorily dispersed therein is applied onto the light emitting device at the same temperature, then the powdered epoxy resin derived from triazine is melted at a temperature higher than the melting point so as to quickly react with the curing agent, and the epoxy resin derived from triazine can be turned into transparent solid while maintaining the fluorescent substance dispersed therein. As a result, color unevenness can be improved without decreasing the efficiency of extracting light to the outside. Moreover, the curing solution containing the resin powder undergoes less change in the viscosity before curing compared to a curing solution containing a liquid resin. Also because the epoxy resin derived from triazine quickly cures, evaporation of the curing agent can be restricted to the evaporation that has occurred before the start of curing, thus making it possible to cure the resin satisfactorily.

Particle shape of the epoxy resin powder may also be retained to some extent after curing, by setting the curing temperature. For example, the resin may be cured while retaining the interface between the powder particles so that the powder articles do not completely fuse with each other, with the result of light diffusing interfaces formed in the color converting member 5. This improves the unevenness in color produced by the light emitting apparatus by the diffusion of light in the color converting member 5.

Composition of the epoxy resin derived from triazine and the curing agent included in the color converting member are preferably in a range from 100:80 to 100:240. When the curing agent content is higher than the range described above, non-reacted curing agent remains in the resin leading to lower moisture resistance of the light emitting device. When the content of the curing agent is lower than the range described above, much time is taken to melt and then cure the epoxy resin derived from triazine, thus making it difficult to solidify while maintaining the dispersion of the fluorescent substance, and curing failure may result which decreases the reliability of the resin.

When such a method is employed as described above, since the mixture solution including the resin powder and the fluorescent substance dispersed therein is used, the fluorescent substance can be maintained in a state of satisfactorily dispersed in the mixture solution, thus improving the workability. Moreover, since it is not necessary to apply to the light emitting device while mixing, possibility of a foreign matter to mix in the mixture solution is eliminated, thus improving the reliability. Preparing the mixture solution at a temperature lower than the melting point of the resin powder to be used and curing the solution that has been applied at a temperature higher than the melting point makes it possible to make a color conversion type light emitting apparatus that has high reliability without color unevenness.

The respective constitutions will now be described in detail.

(Epoxy Resin Derived from Triazine)

The epoxy resin derived from triazine is preferably an epoxy resin as a derivative of 1,3,5-triazine ring. For example, it is an epoxy resin having a structure wherein an epoxy group is added to any of nitrogens at the 1, 3 and 5 positions of 1,3,5-triazine ring. Particularly, an epoxy resin having an isocyanurate ring is superior in light resistance and satisfactorily assists dispersion of a fluorescent substance. The epoxy resin preferably has a structure wherein hydrogens combined with nitrogens at the 1, 3 and 5 positions of isocyanurate are substituted with a proper epoxide group. The epoxide group to be substituted or added may be a simple one such as 2,3-epoxypropanol or may have a high-molecular weight chain structure having an epoxide group at the end. The epoxy resin preferably has two epoxide groups, more preferably three epoxide groups, in an isocyanurate ring. For example, triglycidyl isocyanurate and tris (α-methyl glycidyl)isocyanurate can be used. The curing reaction between triglycidyl isocyanurate (=tris(2,3-epoxypropyl)isocyanurate) and an acid anhydride curing agent as an example of the epoxy resin derived from triazine according to the present invention is shown in FIG. 3.

The epoxy resin derived from triazine is a powdered resin and has a melting point of 100° C. to 115° C., while the epoxy resin has a high melting point of 80° C. to 100° C. when mixed with a curing solution. The epoxy resin is stable in the form of powder and has no reactivity, but has high reactivity when liquefied and exhibits light transmission properties after curing. In the present invention, taking notice of the above feature of the epoxy resin derived from triazine, color unevenness is suppressed and also a light emitting apparatus with less deterioration with a lapse of time is realized by incorporating the epoxy resin derived from triazine into the color converting member coated directly with the light emitting device.

(Curing Agent)

In the present invention, an acid anhydride is preferably used as a curing agent. To obtain requisite light resistance, one, two or more kinds of polybasic acid polycarboxylic anhydrides, which chemically have neither non-aromatic nor carbon double bond, are preferred. Specific examples thereof include hexahydrophthalic anhydride, methylhexahydrophthalic anhydride, trialkyltetrahydrophthalic anhydride and hydrogenated methylnadic anhydride. It is particularly preferred to use, as the acid anhydride, methylhexahydrophthalic anhydride excellent in balance between curing reactivity and moisture resistance. Although these acid anhydrides have high volatility, poor curing due to lack of the curing agent can be suppressed by using in combination with the epoxy resin derived from triazine.

A cation curing agent having low volatility such as aromatic sulfonium salt can be used. However, the cation curing agent is likely to absorb light having a short wavelength shorter than that of blue light and, therefore, the epoxy resin cured by the cation curing agent is likely to cause yellowing due to irradiation with light having a short wavelength. Therefore, when using the epoxy resin composition cured by the cation curing agent in an optical semiconductor device that emits or receive blue light or light having a short wavelength shorter than that of blue light, yellowing of the resin is likely to occur, thereby to cause light emission unevenness. In case of a light converting type light emitting apparatus containing a fluorescent substance, since light is trapped with high density by the fluorescent substance precipitated in the vicinity of the light emitting device, severe yellowing tends to occur Since the curing reaction due to the cation curing agent proceeds only by the ring-opening reaction between the epoxy resins, the resulting epoxy resin composition has a three-dimensional network wherein ether bonds are arranged comparatively regularly and has poor flexibility. Therefore, when the light emitting device is directly coated with the epoxy resin cured by the cation curing agent, large stress is likely to be produced between the light emitting tip and the resin during heating and cooling of the light emitting apparatus.

To improve the flexibility of the epoxy resin composition cured by the cation curing agent, the epoxy resin to be cured can be mixed with a low-molecular weight reactive diluent such as monoglycidyl ether, polyglycol diglycidyl ether or tertiary carboxylic acid monoglycidyl ether. Since the reactive diluent prevents curing of the epoxy resin, when a large amount of the reactive diluent is mixed, it becomes necessary to increase the amount of the cation curing agent. Increase of the amount of the cation curing agent makes yellowing of the epoxy resin composition worse.

(Promoter)

The epoxy resin composition may contain a promoter. Alcohols and polyols, which serve as the promoter, not only impart flexibility to a cured article, thereby to improve peel resistance, but also serve as a compatibilizing agent of a curing accelerator described hereinafter. To obtain required light resistance, alcohols and polyols are preferably any of $C_{2-12}$ straight-chain, branched, alicyclic and ether group-containing alcohols and polyols which have neither non-aromatic nor carbon double bond in a chemical structure thereof. Specific examples thereof include propanol, isopropanol, methylcyclohexanol, ethylene glycol, glycerin, trimethylolpropane and ethylene glycol monomethyl ether.

Proper amount of alcohols and polyols is preferably in a range from 1 to 30 parts by weight, and more preferably from 5 to 15 parts by weight, in case of a low-molecular weight diol such as ethylene glycol. Proper amount of alcohols and polyols is influenced by the chemical structure and the amount of the curing accelerator because it is the compatibilizing agent of the curing accelerator.

(Curing Accelerator)

The epoxy resin compound may contain a curing accelerator. Examples of the curing accelerator include 1. tertiary amines or imidazoles and/or organic carboxylic acid salts thereof, 2. phosphines and/or quaternary salts thereof, 3. organic acid metal salts, 4. metal-organic chelate compounds and 5. aromatic sulfonium salts. These curing accelerators can be used alone, or two or more kinds of them can be used in combination.

Specific examples of tertiary amines or imidazoles and organic carboxylic acid salts thereof include 2,4,6-tris (diaminomethyl)phenol, 2-ethyl-4-methylimidazole, 1,8-diazabicyclo(5,4,0)undecene-7 (hereinafter abbreviated to DBU) and octylates thereof. It is particularly preferred to add DBU octylate having excellent light transmission properties of the cured article, as the curing accelerator, the amount in a range from 0.01 to 1 parts by weight based on 100 parts by weight of the epoxy resin. In view of the moisture resistance of the light emitting diode, the amount is more preferably from 0.1 to 0.5 parts by weight.

Specific examples of phosphines and quaternary salts thereof include triphenyiphosphine, tributylphosphine, benzyl triphenylphosphonium bromide and benzyl tributylphosphonium bromide. It is preferred to add benzyl triphenylphosphonium bromide having excellent light transmission properties of the cured article in the amount in a range from 0.01 to 1 parts by weight based on 100 parts by weight of the epoxy resin. In view of the moisture resistance of the light emitting diode, the amount is more preferably from 0.1 to 0.5 parts by weight.

Specific examples of organic acid metal salts include zinc octylate, zinc laurate, zinc stearate and tin octylate, each having no carbon double bond. In proportion to an increase in number of carbon atoms of the organic carboxlic acid component, the solubility of organic acid metal salts in the epoxy resin is lowered. Since zinc octylate may be used in the amount within the widest range and is liquid, it does not require a long time for dispersion and dissolution. Therefore, it is preferred to add zinc octylate in the amount in a range from 1 to 10 parts by weight in view of the curability. In view of the light transmission properties of the cured article, the amount is more preferably in a range from 1 to 5 parts by weight.

Specific examples of the metal-organic chelate compound include acetylacetone zinc chelate, benzoylacetone zinc chelate, dibenzoylmethane zinc chelate and acetoacetic acid ethylzinc chelate, each being made of zinc, which exerts no influence on the light transmission properties, and $\beta$-diketone. Excellent light resistance and heat resistance can be imparted to the epoxy resin by using a zinc chelate compound. Since the zinc chelate compound has selective and mild curing accelerating action to the epoxy resin, it becomes possible to bond at low stress even in case of being made mainly of a low-molecular weight monomer such as alicyclic epoxy resin. In view of ease of handling, the zinc chelate compound preferably contains bis(acetylacetonato) aquazinc (2) $[Zn(C_5H_7O_2)_2(H_2O)]$ including acetylacetone as a chelate component in the amount in a range from 1 to 10 parts by weight. In view of the solubility in the epoxy resin, the amount is preferably in a range from 1 to 5 parts by weight.

When using an aromatic sulfonium salt as the curing accelerator, it becomes unnecessary to add an acid anhydride, as a curing agent, in the epoxy resin composition. Since the aromatic sulfonium salt is decomposed by heat and/or ultraviolet light having a wavelength of 360 nm or shorter to generate a cation, an epoxy resin cation-polymerized cured article can be obtained. The resulting cured article is ether-crosslinked and is physically and chemically stable as compared with those cured by the curing agent made of the acid anhydride. Specifically, triphenylsulfonium antimony hexafluoride and triphenylsulfonium phosphorus hexafluoride can be used as the aromatic sulfonium salt. Since triphenylsulfonium antimony hexafluoride achieves high curing rate and sufficient curing even when using in a small amount, the amount is preferably in a range from 0.01 to 0.5 parts by weight based on 100 parts by weight of the epoxy resin and the amount is more preferably in a range from 0.05 to 0.3 parts by weight taking account of discoloration of the cured article due to heat generation during the chain polymerization.

(Antioxidant)

The epoxy resin compound may contain an antioxidant. Examples of the antioxidant include 1. phenol-based antioxidant 2. phosphite-based antioxidant and 3. sulfur-based antioxidant and these antioxidants can be used alone, or two or more kinds of them can be used in combination. By the use of the phenol-based antioxidant and phosphite-based antioxidant in combination, for example, use of phenol-based antioxidant and phosphite-based antioxidant in combination or use of phenol-based antioxidant and sulfur-based antioxidant in combination, a synergistic effect is obtained and thus the effect of preventing initial coloration and the effect of suppressing heat deterioration are improved. Specific examples of the phenol-based antioxidant include 2,6-di-tert-butyl-p-cresol, pentaerythritol and octadecyl-3-(3,5-di-tert-butyl-4-hydroxyphenyl)propionate. The antioxidant is preferably added in the amount in a range from 0.01 to 2 parts by weight, and more preferably from 0.1 to 0.5 parts by weight, based on 100 parts by weight of the epoxy resin. Consequently, the light transmission properties of the cured article is improved. Specific examples of the phosphite-based antioxidant include triphenylphosphite, 2,2-methylenebis(4,6-di-tert-butylphenyl)octyl phosphite and 9,10-dihydro-9-oxa-10-phosphaphenanthrene-10-oxide. When the antioxidant is added in the in a range from 0.01 to 10 parts by weight based on 100 parts by weight of the epoxy resin, initial coloration of the cured article can be satisfactorily prevented. When the antioxidant is added in the amount in a range from 0.1 to 2 parts by weight, the moisture resistance of the light emitting diode can be improved. Specific examples of the sulfur-based antioxidant include dilaurylthio dipropionate and distearylthio dipropionate. The antioxidant is preferably added in the amount in a range from 0.01 to 5 parts by weight, and more preferably from 0.1 to 2 parts by weight, based on 100 parts by weight of the epoxy resin, thereby making it possible to improve the moisture resistance of the cured article.

(Diluent)

The diluent may be added in the epoxy resin compound. The diluent include non-reactive and reactive diluents. Examples of the reactive diluent include glycidyl ether, diepoxide and triepoxide of higher alcohol. The diluent is preferably added in the amount in a range from 3 to 10 parts by weight based on 100 parts by weight of the epoxy resin, thereby making it possible to secure the operability.

(Fluorescent Substance)

The fluorescent substance used in the light emitting apparatus of the present invention may be one that is based on yttrium aluminum oxide fluorescent substance activated with cerium, that is capable of emitting light upon excitation of light emitted by the semiconductor light emitting device that uses a nitride semiconductor as the light emitting layer. Specifically, the yttrium aluminum oxide fluorescent substance may be $YAlO_3$:Ce, $Y_3Al_5O_{12}$:Ce (YAG: Ce) or $Y_4Al_2O_9$:Ce or a mixture thereof. The yttrium aluminum oxide fluorescent substance with at least one of Ba, Sr, Mg, Ca and Zn added thereto may also be used. Adding Si enables it to restrain the crystal growth and regulate the sizes of the fluorescent substance particles. In this specification, the term yttrium aluminum oxide fluorescent substance activated with Ce is broadly interpreted so as to mean any fluorescent substance of which yttrium is partially or totally replaced with at least one element selected from among a group of Lu, Sc, La, Gd and Sm and/or aluminum is partially or totally replaced with at least one element selected from among a group of Ba, Tl, Ga and In.

More specifically, a photoluminescence fluorescent substance represented by general formula of $(Y_4Gd_{1-z})_3Al_5O_{12}$:Ce ($0<z\leq1$), or a photoluminescence fluorescent substance represented by general formula $(Re_{1-a}Sm_a)_3Re'_5O_{12}$:Ce ($0\leq a<1$, $0\leq b\leq1$, where Re is at least one kind selected from among Y, Gd, La and Sc, Re' is at least one kind selected from among Al, Ga and In). This fluorescent substance, because of garnet structure, has resistance against heat, light and moisture, and is capable of absorbing light with excitation spectrum having a peak around 450 nm. It also emits light with a broad emission spectrum having a peak near 580 nm tailing to 700 nm. Efficiency of excited light emission of the photoluminescence fluorescent substance in a region of wavelengths longer than 460 nm can be improved by including Gd (Gadolinium) in the crystal. As the Gd content is increased, emission peak shifts toward longer wavelength and the entire emission spectrum also shifts toward longer wavelength. This means that Gd content maybe increased when emission of reddish light is required. As the Gd content increases, luminance of light emitted from photoluminescence by blue light tends to decrease. In addition to Ce, such element may also be added as Tb, Cu, Ag, Au, Fe, Cr, Nd, Dy, Co, Ni, Ti or Eu. In the composition of yttrium aluminum garnet fluorescent substance having garnet structure, replacing a part of Al with Gd causes the emission spectrum to shift toward shorter wavelength. Replacing a part of Y with Gd causes the emission spectrum to shift toward longer wavelength. When replacing a part of Y with Gd, it is preferable to limit the proportion of Y atoms replaced with Gd less than 10% and control the Ce content in a range from 0.03 to 1.0. When the proportion of replacement with Gd is less than 20%, green component increases and red component decreases, while red component can be added by increasing the Ce content thereby achieving the desired color tone without decreasing the luminance. Such a composition also allows it to achieve good temperature characteristic and improve the reliability of the light emitting diode. When photoluminescence fluorescent substance that is adjusted to include much red component is used, a light emitting apparatus capable of emitting an intermediate color such as pink can be made. Such a photoluminescence fluorescent substance can be made by using oxides of Y, Gd, Al and Ce or compounds that can be easily turned into oxides at a high temperature and mixing these material in stoichiometrical proportions. Alternatively, coprecipitation of a solution of rare earth elements such as Y, Gd and Ce in oxalic acid in stoichiometrical proportions may be fired and mixed with aluminum oxide to obtain a material. A fluoride such as barium fluoride or ammonium fluoride is added as a flux to this material, that is then put into a crucible and fired in air at a temperature in a range from 1350 to 1450° C. for 2 to 5 hours to obtain a fired material. Then the fired material is subjected to ball-mill process in water, washing, separation, drying and sieving to obtain a fluorescent substance.

The photoluminescence fluorescent substance of the light emitting apparatus according to the present invention may comprise a mixture of two or more kinds of yttrium aluminum garnet fluorescent substance activated with cerium, or a mixture of yttrium aluminum garnet fluorescent substance activated with cerium and another kind of fluorescent substance. Light emission with a desired color tone can be easily achieved by mixing two kinds of yttrium aluminum garnet fluorescent substance having Y component replaced with Gd to different degrees. In particular, improvement of color rendering performance and luminance can be achieved at the same time by making coarse fluorescent substance particles from a heavily substituted fluorescent substance and making medium fluorescent substance particles having median particle size smaller than that of the coarse fluorescent substance particles front a fluorescent substance of which component is substituted to a lesser degree or not substituted at all.

Particle size of the fluorescent substance used in the present invention is preferably in a range from 10 to 50 $\mu$m, and more preferably in a range from 15 to 30 $\mu$m. This particle size enables it to improve the luminance of the light emitting apparatus of integrated nitride semiconductor while preventing the light from being blocked. The fluorescent substance of particle size in the range described above has high light absorbing efficiency and high conversion efficiency, and has broader band of excitation wavelengths. Since the color converting member of the present invention comprises powder resin and fluorescent substance being mixed and dispersed, the color converting member can be made with the coarse fluorescent substance particles that has the good optical properties dispersed uniformly, thus enabling it to make the light emitting apparatus capable of emitting light with high luminance and high reliability. A fluorescent substance having particle size not larger than 15 $\mu$m, on the other hand, is likely to coagulate and precipitate in a liquid resin, thus decreasing the light transmission efficiency. In the present specification, particle size refers to a value determined from volumetric particle size distribution curve. The volumetric particle size distribution curve is determined from particle size distribution measured by laser diffraction and diffusion method. Specifically, the material in question is dispersed in 0.05% water solution of sodium hexametaphosphate at ambient temperature of 25° C. and humidity of 70%, and the particle size distribution is measured in a range from 0.03 to 700 $\mu$m with laser diffraction particle size distribution measuring instrument (SALD-2000A). The median particle size is defined as the particle size of 50% accumulated particle size in the volumetric particle size distribution curve. The fluorescent substance used in the present invention preferably has median particle size in a range from 15 to 50 $\mu$m. It is also preferable that the fluorescent substance having this median particle size is included in high concentration from 20% to 50%. Use of such a fluorescent substance having less variance in the particle sizes enables it to make light emitting apparatus having good color tone with color unevenness being suppressed. When fine fluorescent substance particles having median particle size of 0.3 $\mu$m or larger and smaller than 1 $\mu$m is included, this fluorescent substance hardly emits light but allows it to control the viscosity of the resin without decreasing the luminous intensity compared to a case where other dispersant is used, and uniform light emission can be achieved since the fluorescent substance also has light diffusing effect.

(Diffusing Agent)

According to the present invention, a diffusing agent may also be added to the color converting member, in addition to the fluorescent substance. Specifically, barium titanate, titanium oxide, aluminum oxide, silicon oxide or the like may be preferably used as the diffusing agent. Thus a light emitting apparatus having good directivity can be made.

The diffusing agent referred to in this specification preferably has median particle size of 0.3 nm or larger and smaller than 5 $\mu$m, and more preferably 0.3 nm or larger and smaller than 1 $\mu$m. Such a diffusing agent causes satisfactory random reflection of light emitted by the light emitting device and the fluorescent substance, and suppresses color unevenness that tends to be caused by the use of fluorescent substance having large particle size, and is therefore preferable. It also enables it to decrease the half width of the emission spectrum to obtain a light emitting apparatus of higher color purity. The diffusing agent having particle size of 0.3 $\mu$m or larger and smaller than 1 $\mu$m is less likely to interfere with the light of the wavelength emitted by the light emitting device while allowing it to control the viscosity of the resin without decreasing the luminous intensity. This makes it possible to maintain the fluorescent substance uniformly dispersed in the resin that is contained in a syringe when applying the color converting member in a process of potting or the like, thereby making it possible to manufacture with a high yield of production even when a fluorescent substance of large particle size that is relatively difficult to handle is used. The diffusing agent used in the present invention has different effects depending on the particle size and may be selected or combined according to the intended application.

(Mounting Member)

For the mounting member used in the present invention, epoxy resin compound is used that bonds the semiconductor light emitting device and the base material 104 with satisfactory mass producibility, and prevents deterioration due to the light emitted by the semiconductor light emitting device. The epoxy resin compound may include a curing agent, a promoter and/or a curing assisting agent as well as an alicyclic epoxy resin and an acid anhydride added thereto. It needs not to say that light resistance, heat resistance and bonding performance can be controlled by means of the chemical structure and concentration of the additives. The epoxy resin compound may also be used as an electrically conductive paste by adding Ag, Au or ITO.

(Base Material)

The base material 104 is used for the placement of the semiconductor light emitting device. The base material 104 is preferably one that is capable of effectively reflecting and utilizing the light emitted by the semiconductor light emitting device. The base material 104 may have such a size that is enough to bond with the mounting member, and may be of various shape and material according to the desired characteristic. Specifically, lead terminal used in a light emitting diode or the package of chip-type LED is preferably used.

One semiconductor light emitting device or more can be placed on the base material. An LED chip having a plurality of emission wavelengths may also be placed for the purpose of controlling the wavelength of emitted light. In the case of placing an LED chip that uses a nitride semiconductor formed on SiC or the like, sufficient electrical conductivity is required as well as bonding performance. In case the electrodes of the semiconductor light emitting device are connected to the substrate (lead electrode or the like) by using conductive wires, the base material preferably has good connectivity with the conductive wire. For the base material that is required to have such characteristics as described above, lead electrode, package or other appropriate configuration made of steel, copper, steel-interfused copper, tin-interfused copper, aluminum or steel plated with copper, gold or silver, ceramic or synthetic resin material may be used.

(Electrically Conductive Wire)

The electrically conductive wire that is an electrical connection member is required to have good ohmic property with the electrode of the semiconductor light emitting device, mechanical connectivity, electrical conductivity and thermal conductivity. Thermal conductivity is preferably 0.01 cal/cm$^2$/cm/° C. or higher, and more preferably 0.5 cal/cm$^2$/cm/° C. or higher. In consideration of workability, the electrically conductive wire has a diameter preferably 10 μm or larger and not larger than 45 μm. The electrically conductive wire may be made of such a metal as gold, copper, platinum, aluminum or an alloy thereof. Such an electrically conductive wire can easily connect between the electrodes of the LED chip and the inner lead and mounting lead by means of wire bonding equipment.

(Molding Member)

The molding member is provided for the purpose of protecting the semiconductor light emitting device and other members from the external environment. As such, the color converting member may be used as the molding member, or a light transmitting resin other than the color converting member may be formed as the molding member. The molding member may be formed in a desired shape such as convex lens or concave lens. As the molding member that does not make contact with the semiconductor light emitting device, alicyclic epoxy resin is preferably used similarly to the mounting resin or color converting member of the present invention.

More specifically, the light transmitting resin constituting the molding resin is preferably an alicyclic resin composition containing 5% by weight or less of an aromatic component (including the case of containing no aromatic epoxy resin), and more preferably an alicyclic resin composition containing 1 ppm or less of inorganic chlorine and 5 ppm or less of organic chlorine. The light transmitting resin used in the molding member is more preferably an alicyclic epoxy resin containing an acid anhydride. Various additives can be added, in addition to various diffusing agents and colorants.

EXAMPLE 1

As the light emitting apparatus of the present invention, a lamp-type light emitting diode of long wavelength converting type is formed as shown in FIGS. 1A and 1B. An LED chip that has a light emitting layer made of InGaN and has main light emission peak at 470 nm is used. The LED chip is formed by the MOCVD process. Specifically, a cleaned sapphire substrate is placed in a reaction chamber. TMG (trimethyl) gas, TMI (trimethyl-indium) gas, TMA (trimethyl-aluminum) gas or ammonia gas is used as the film forming reaction gas, hydrogen gas is used as the carrier gas, and silane gas and cyclopentadiamagnesium is used as the impurity gas.

The LED chip 1 has such a layer constitution formed on the sapphire substrate, as low-temperature buffer layer of AlGaN, undoped GaN (about 15000 Å thick) for improving crystallinity, Si-doped GaN (about 21650 Å thick) having electrode formed thereon and serves as n-type contact layer, undoped GaN (about 3000 Å thick) for improving crystallinity, a multi-layer film constituted from super lattice of undoped GaN (about 50 Å thick) and Si-doped GaN (about 300 Å thick) and serving as n-type cladding layer, a multi-layer film constituted from super lattice of undoped GaN (about 40 Å thick) and undoped InGaN (about 20 Å thick) for improving the crystallinity of the light emitting layer to be formed thereon, a light emitting layer consisting of a multi-layer film constituted from undoped GaN (about 250 Å thick) and InGaN (about 30 Å thick) having multiple quantum well structure, a multi-layer film constituted from super lattice of Mg-doped InGaN (about 25 Å thick) and Mg-doped GaAlN (about 40 Å thick) and serving as p-type contact layer, and Mg-doped GaN (about 1200 Å thick) that is p-type contact layer (a GaN layer is formed at a low temperature on the sapphire substrate as a buffer layer, and p-type semiconductor is annealed at 400° C. or higher after growth). Then the p-type and n-type contact layers are exposed by etching on the same surface side of the nitride semiconductor on the sapphire substrate. Positive and negative electrodes are formed by sputtering process on the respective contact layers. The semiconductor wafer thus completed is scribed and diced with an external force to separate into individual LED chips. The LED chip has monochromatic peak wavelength at 470 nm. Last, the entire device is covered with an insulating protective film made of $SiO_2$ having thickness of 2 μm leaving only the bonding surface of the electrodes being exposed, so that the light transmission rate is 90% at wavelength of 470 nm.

With a pair of lead electrodes 7a and 7b made of steel-interfused copper being used, the LED chip is mounted at the bottom of a cup that is mounted at the distal end of a first lead 7a by using an epoxy resin compound as the mounting resin. Specifically, the epoxy resin compound is applied to the inside of the cup at the distal end using a syringe dispenser, and the LED chip 1 is mounted therein. This assembly is heated to 170° C. for 75 minutes, so as to cure the epoxy resin compound and fasten the LED chip.

The lead electrodes 7a and 7b are pressed in a direction parallel to the bottom surface from the bottom surface upward in a region that is not sealed with the molding member, or pressed from both sides of the bottom surface side and the opposite side, in order to smooth the burred portion on the bottom surface of the lead electrode generated when punching out the lead electrode. The lead electrode is coated with lusterless plating having thickness of 3 μm after prime treatment of copper plating.

Various resins can be used as the mount resin. In the present invention, a colorless transparent epoxy resin composition prepared by uniformly mixing 100 parts by weight of 3, 4-epoxycyclohexylmethyl-3', 4'-epoxycyclohexylcarboxylate as a non-aromatic epoxy resin having high reliability with 90 parts by weight of methylhexahydrophthalic anhydride, 10 parts by weight of ethylene glycol, 4 parts by weight of zinc octylate and 2.5 parts by weight of bis (acetylacetonato) aqua zinc (2) was used.

Then, the positive and negative electrodes of the LED chip 1 are wire-bonded with the mount lead and the inner lead using gold wires so as to establish electric continuity.

Then, a colorless transparent curing solution is prepared by mixing 100 parts by weight of methylhexahydrophthalic anhydride, 2 parts of ethylene glycol serving as a promoter and 0.5 parts by weight of benzyltriphenylphosphonium bromide.

Then, a mixed solution is prepared by mixing 328.32 parts by weight of the curing solution with 100 parts by weight of 1,3,5-triglycidyl isocyanurate, as an epoxy resin derived from triazine, having a melting point of 100° C. (epoxy equivalent ratio of epoxy resin derived from triazine to the curing agent is 1:2) at normal temperature.

As the fluorescent substance 4, $(Y_{0.8}Gd_{0.2})_{2.965}Al_5O_{12}:Ce0.035$ having median particle size of 21.429 μm having about 20% of Y atoms being replaced with Gd is formed. The fluorescent substance is constituted from coarse fluorescent substance particles and fine fluorescent substance particles, and accumulated proportion is 4.6% and particle sizes are from 1.371 μm to 8.379 μm in a flat region where gradient of the volumetric particle size distribution curve is zero. That is, 4.6% of the entire fluorescent substance is fine fluorescent substance particles having particle sizes smaller than 1.371 μm and the remaining 95.6% is coarse fluorescent substance particles having particle sizes larger than 8.379 μm. Median particle size of the fluorescent substance that has been classified by precipitation so as to achieve such a particle size distribution is 21.4 μm, and the frequency at the median particle size is 29.12%. Peak particle size of the fine fluorescent substance particles is 0.613 μm and peak particle size of the coarse fluorescent substance particles is 22.908 μm.

In order to obtain light of (x, y=0.33, 0.33) in the chromaticity chart of CIE, the powdered fluorescent substance that has been controlled as described above and the mixture solution are mixed in weight proportion of 28:100 and dispersed in a ball mill for 24 hours. The dispersed solution thus obtained is potted with a syringe into a recess of a casing wherein the LED chip is connected to a pair of lead electrodes with gold wires and, after preheating at 170° C., cured for two hours in an oven, thereby completing the color converting member 5.

Then the epoxy resin compound in liquid state is poured into a casting case of bullet shape mold, and part of the mounting lead and the inner lead that are disposed in the cup wherein the LED chip is encased is inserted into the casting case and subjected to primary curing at 120° C. for two hours. After the primary curing, the light emitting diode is taken out of the casting case and subjected to secondary curing at 140° C. for four hours, thereby forming the molding member 6.

Figure 5:
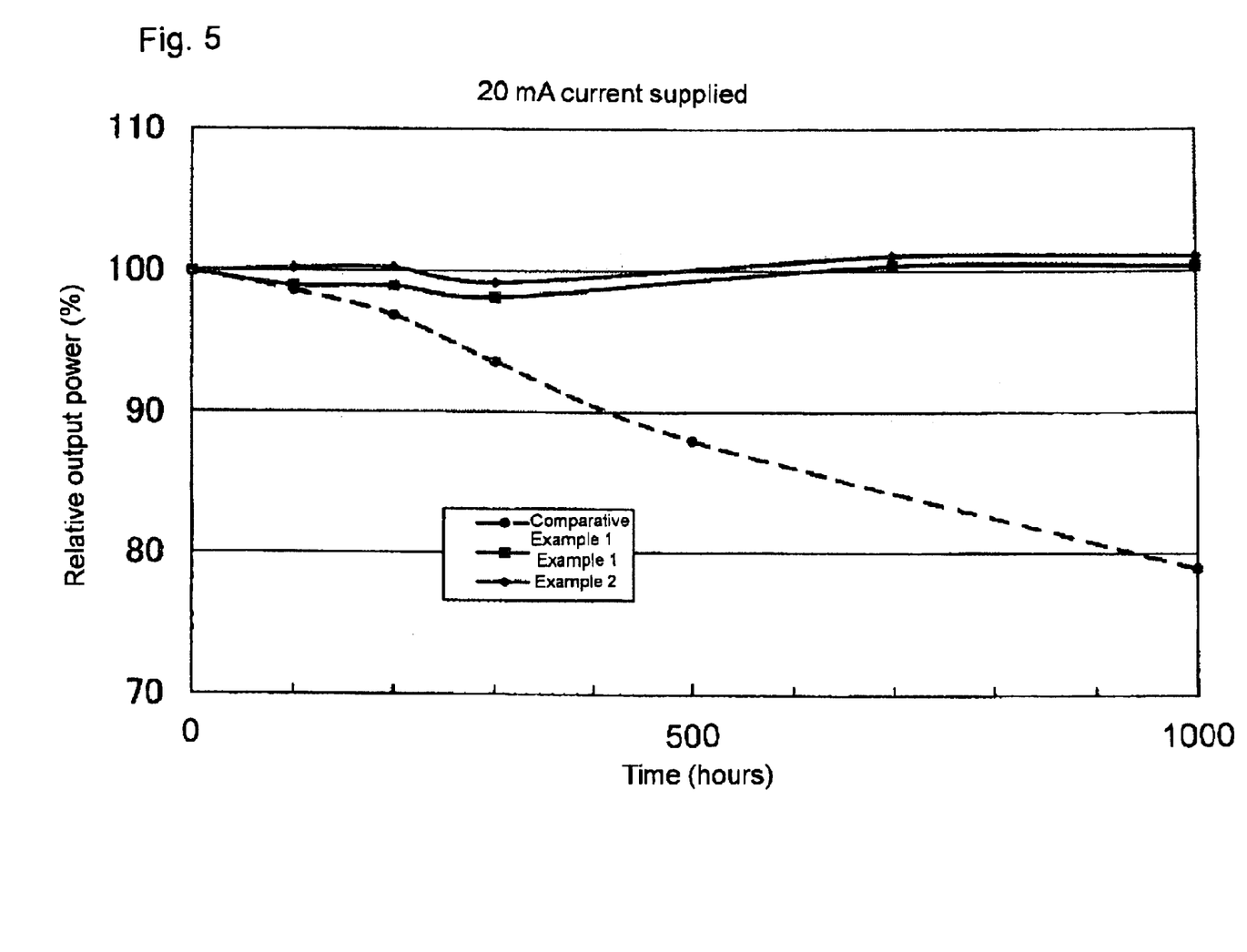
FIG. 5 is a graph showing the relationship between the relative output power and the hours of operation as current of 20 mA was supplied in the first and second embodiments and a comparative example.

The light emitting diode made as described above contains much fluorescent substance dispersed satisfactorily therein, with very thin fluorescent substance layer precipitated around the light emitting device, and therefore provides uniform light emission of high output power. Relationship between the initial relative output power and the hours of operation as current of 20 mA was supplied is shown in FIG. 5. It can be seen that the optical output power hardly decreases until the first 1000 hours of operation has elapsed, and the optical output power can be maintained for 3500 hours.

COMPARATIVE EXAMPLE

Light emitting diode was manufactured in the same manner as in Example 1, except for using an epoxy resin, that is liquid at the room temperature, instead of the epoxy resin derived from triazine. Relationship between the initial relative output power and the hours of operation as current of 20 mA was supplied to this light emitting diode is shown in FIG. 5. Optical output power decreases to 87% after 500 hours of operation and to 78% after 1000 hours of operation, and color unevenness is observed.

EXAMPLE 2

100 Parts by weight of 1,3,5-triglycidyl isocyanurate, which is an epoxy resin derived from triazine as a base agent, and 328.32 parts by weight of the above curing solution (epoxy equivalent ratio of epoxy resin derived from triazine to the curing agent is 1:2) were mixed to prepare a mixed solution. The resulting mixed solution was mixed with the above fluorescent substance and $SiO_2$ having a center particle diameter of 0.5 μm at a mixing ratio of 100:23:35 and then uniformly dispersed in a ball mill for 24 hours to obtain a dispersion. In the same manner as in Example 1, except that the dispersion was prepared as described above, a light emitting diode was manufactured. As shown in FIG. 5, the same effect as that in Example 1 can be obtained.

EXAMPLE 3

100 Parts by weight of 1,3,5-triglycidyl isocyanurate, which is an epoxy resin derived from triazine as a base agent, and 328.32 parts by weight of the curing agent were mixed to prepare a mixed solution. The resulting mixed solution was mixed with the fluorescent substance, $SiO_2$ and a diluent at a mixing ratio of 100:23:35:10 and then uniformly dispersed in a ball mill for 24 hours to obtain a dispersion. In the same manner as in Example 1, except that the dispersion was prepared as described above, a light emitting diode was manufactured. As a result, the same effect as that in Example 1 can be obtained.

What is claimed is:

1. A light emitting apparatus comprising a light emitting device, a fluorescent substance capable of absorbing at least a portion of light emitted by the light emitting device and emitting light having a different wavelength, and a color converting member which contains the fluorescent substance and directly coat the light emitting device, wherein the color converting member contains at least an epoxy resin derived from triazine, wherein said epoxy resin triazine is incorporated into the main chain of said epoxy resin.

2. The light emitting apparatus according to claim 1, wherein the epoxy resin derived from triazine has an isocyanurate ring.

3. The light emitting apparatus according to claim 2, wherein the epoxy resin has three epoxide groups in an isocyanurate ring.

4. The light emitting apparatus according to claim 1, wherein the color converting member contains an acid anhydride curing agent.

5. The light emitting apparatus according to claim 1, wherein a ratio of the epoxy resin derived from triazine to an acid anhydride curing agent is from 100:80 to 100:240 in the color converting member.

* * * * *